United States Patent [19]

Rode

[11] Patent Number: 4,606,113
[45] Date of Patent: Aug. 19, 1986

[54] METHOD OF MANUFACTURING METAL-SEMICONDUCTOR FIELD EFFECT TRANSISTORS USING ORIENTATION DEPENDENT ETCHED RECESSES OF DIFFERENT DEPTHS

[75] Inventor: Ajit G. Rode, Beaverton, Oreg.

[73] Assignee: TriQuint Semiconductor, Inc., Beaverton, Oreg.

[21] Appl. No.: 715,545

[22] Filed: Mar. 25, 1985

Related U.S. Application Data

[63] Continuation of Ser. No. 517,162, Jul. 25, 1983, abandoned.

[51] Int. Cl.⁴ .................. H01L 21/265; H01L 21/302
[52] U.S. Cl. ..................................... 29/571; 29/576 B; 29/580; 148/1.5; 148/187; 156/647; 357/91; 357/23.12
[58] Field of Search ................ 29/571, 576 B, 580; 148/1.5, 187; 156/647; 357/23, 91

[56] References Cited

U.S. PATENT DOCUMENTS

| 4,286,374 | 9/1981 | Hantusch | 29/580 |
| 4,397,711 | 8/1983 | Donnelly et al. | 156/643 |
| 4,403,396 | 9/1983 | Stein | 29/571 |

OTHER PUBLICATIONS

Chang, L. L., IBM-TDB, 24, (1982), 4071.
Lee et al., Appl. Phys. Letts., 37, (1980), 311.
Yokoyama et al., Appl. Phys. Lett., 42 (1983), 270.

*Primary Examiner*—Upendra Roy
*Attorney, Agent, or Firm*—John Smith-Hill; John D. Winkelman; William S. Lovell

[57] ABSTRACT

Field effect transistors are manufactured using a substrate of compound semiconductor material by defining two gate areas which have their longitudinal dimensions so oriented with respect to the crystal axes of the substrate that the substrate material is more readily etchable through one of the gate areas than through the other gate area. The semiconductor material is etched through both the gate areas simultaneously with the same etchant, whereby gate recesses of different respective depths are formed in the substrate. Metal is deposited into the recesses.

10 Claims, 13 Drawing Figures

METHOD OF MANUFACTURING METAL-SEMICONDUCTOR FIELD EFFECT TRANSISTORS USING ORIENTATION DEPENDENT ETCHED RECESSES OF DIFFERENT DEPTHS

This is a continuation, of application Ser. No. 517,162, filed July 25, 1983 now abandoned.

This invention relates to a method of manufacturing metal-semiconductors field effect transistors.

BACKGROUND OF THE INVENTION

The general process of manufacturing metal-semiconductor field effect transistors (MESFETS) is well known. Source and drain regions are formed in a substrate by an N-type impurity which is implanted with a sufficient dose to provide N-plus conductivity, and a channel region is provided between the source and drain regions with an N-type impurity implanted with a lower concentration, sufficient to provide N-minus conductivity. Ohmic contacts are made to the source and drain regions. The channel region is then selectively etched, removing the substrate in a portion of the channel region, and a gate electrode is deposited into the resulting recess.

The threshold voltage of an enhancement-mode MESFET, i.e., the voltage which must be applied to the gate electrode in order to permit current flow between source and drain, is a function of the distance between the bottom of the gate recess and the boundary between the channel region and the substrate, which distance is referred to herein as the "channel depth". The pinch-off voltage of a depletion-mode MESFET, i.e., the voltage which must be applied to the gate electrode in order to cut off the current flow, is also a function of channel depth. The threshold voltage of the enhancement-mode (E-mode) MESFET and the pinch-off voltage of a depletion-mode (D-mode) MESFET are generically referred to hereinafter as the "critical gate voltage". The magnitude of the critical gate voltage of an enhancement-mode MESFET is considerably less than that of a depletion mode MESFET. But for a constant, the critical gate voltage of each type of MESFET is proportional to the product of the impurity concentration in the channel region and the square of the channel depth. Therefore, if the channel depth of an enhancement mode MESFET is to be the same as that of a depletion mode MESFET, it is necessary that the concentrations of impurity in the gate regions of the respective MESFETs be different. This implies two separate channel implantation operations, and use of two different masks to define the regions to be implanted.

It is known that compound semiconductor materials are anisotropic, and etch at different rates in different directions.

SUMMARY OF THE INVENTION

According to a first aspect of the present invention there is provided a method of manufacturing field effect transistors utilizing a substrate of monocrystalline compound semiconductor material having impurity ions implanted therein to a predetermined depth below a main surface of the substrate in at least two regions of the substrate, said method comprising defining two elongated gate areas of said main surface, over said two regions respectively, which gate areas have their longitudinal dimensions so oriented with respect to the crystal axes of the substrate that the substrate material is more readily etchable through one of said gate areas than through the other gate area, etching the semiconductor material through both said gate areas simultaneously with the same etchant, whereby recesses of different respective depths, each less than said predetermined depth, are formed in the substrate, and depositing metal into said recesses.

According to a second aspect of the present invention there is provided a a method of manufacturing a device for controlling transfer of electrical charge within a substrate of monocrystalline compound semiconductor material, said method comprising defining two elongated areas of the surface of the substrate, which elongated areas have their longitudinal dimensions so oriented with respect to the crystal axes of the semiconductor material that the semiconductor material is more readily etchable through one of said areas than through the other area, and etching the semiconductor material through both said elongated areas simultaneously with the same etchant, whereby recesses of different respective depths are formed in the substrate.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
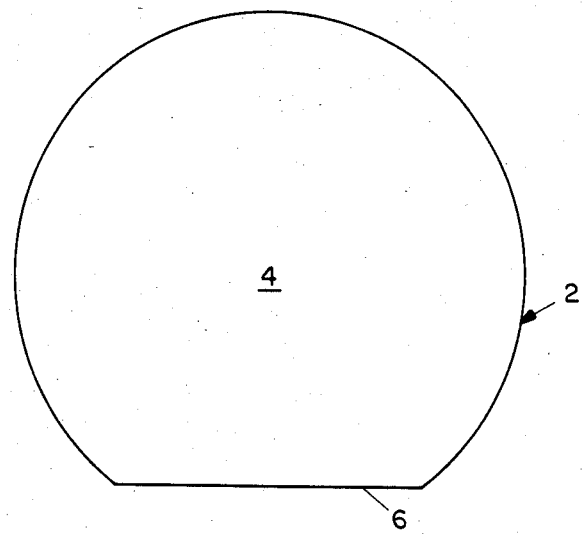
FIG. 1 is a fragmentary plan view of a wafer of semi-insulating gallium arsenide.

FIG. 1 is a plan view of part of a wafer 2 of semi-insulating gallium arsenide in the form in which it is conventionally sold for fabrication of integrated circuits. The top, flat surface 4 of the wafer is parallel to the (100) crystallographic plane, and the flat 6 is parallel to the <110> crystallographic direction.

Figure 2:
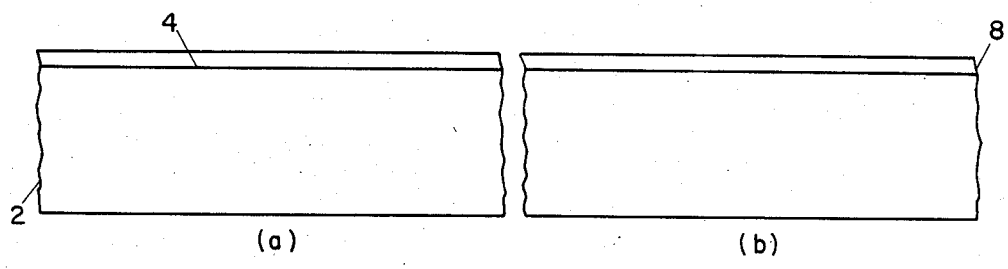
FIGS. 2a–2b to 10a–10b are each a pair of enlarged sectional views o the wafer taken at successive stages in the fabrication of metal-semiconductor field effect transistors, the two views of each pair being taken in mutually perpendicular directions.
Figure 3:
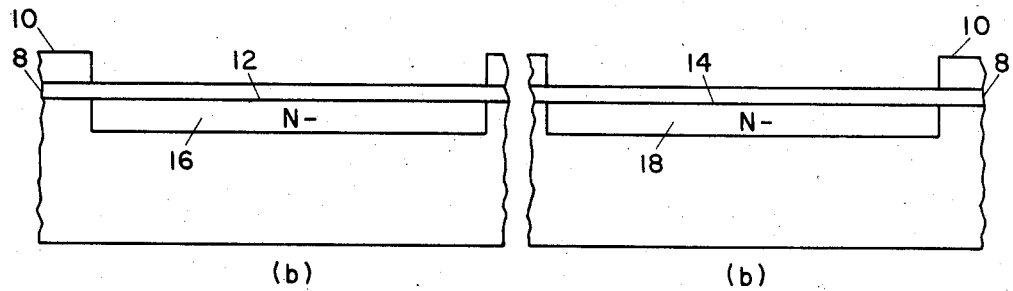

A layer 8 of silicon dioxide (FIG. 2a–2b) is deposited on top of the surface 4 of the wafer, and a layer 10 of photoresist is deposited on top of the layer 8. The layer 10 is patterned to define rectangular areas 12 and 14 of the surface of the wafer, beneath the layer 8, as shown in FIG. 3a–3b.

Figure 4:
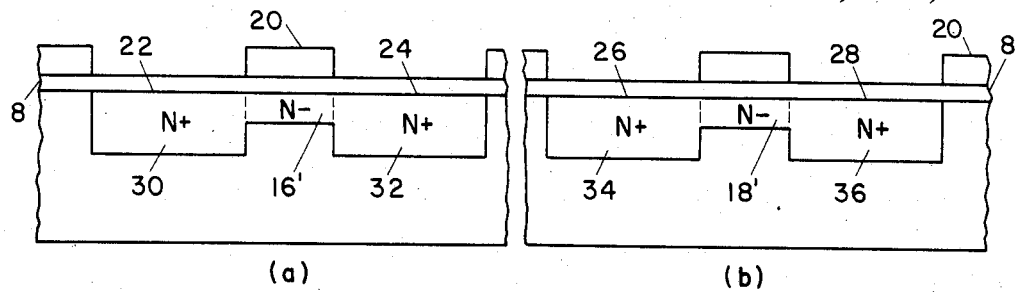

Ions of an N type impurity, such as silicon, are implanted into the wafer through the layer 8, resulting in formation of active device regions 16 and 18 of N-conductivity beneath the rectangular areas 12 and 14. The remaining photoresist of the layer 10 masks the field surrounding the active device regions 16 and 18. The layer 10 is then removed, and a second layer 20 of photoresist is deposited on top of the layer 8 (FIG. 4a–4b). The layer 20 is patterned to define rectangular areas 22, 24, 26 and 28 within the areas 12 and 14, and ions of an N type impurity are again implanted into the wafer through the layer 8, resulting in formation of regions 30, 32, 34 and 36 of N+ conductivity beneath the surface areas 22–28. The regions 30 and 36 ultimately become source regions of the MESFETs, and the regions 32 and 34 become the drain regions of the two MESFETS. The N- portions 16' and 18', of the regions 16 and 18 respectively, defined between the N+ regions 30, 32 and 34, 36 become the channel regions of the MESFETs.

Figure 5:
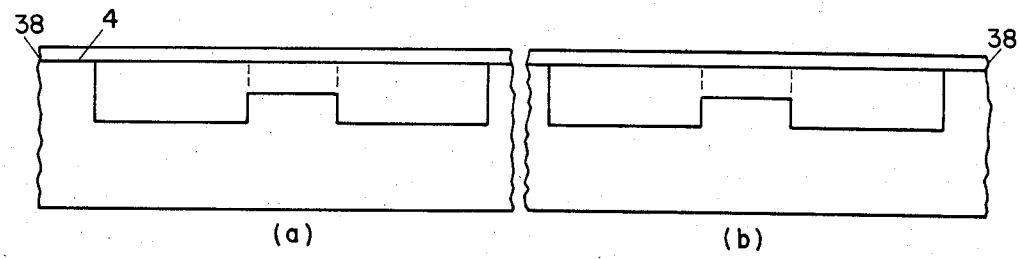
Figure 6:
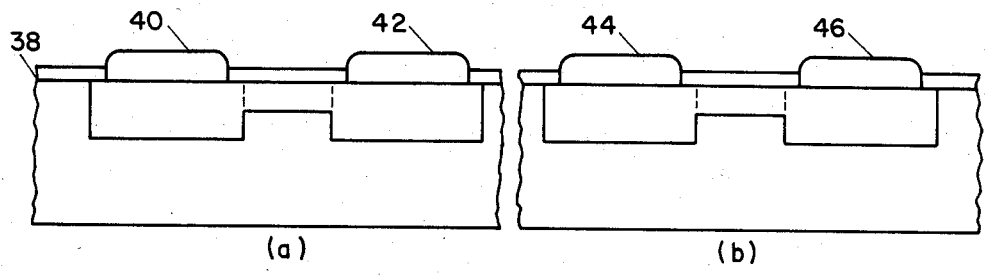

After formation of the N+ regions, the remaining photoresist of the layer 20 is removed, and the wafer is annealed to repair the crystal structure of the wafer and thereby electrically activate the devices. The layer 8 remains in place during the annealing step as an annealing cap. After the annealing has been completed, the layer 8 is removed and a layer 38 of silicon nitride is deposited on top of the surface 4 (FIG. 5a–5b). Vias are cut in the layer 38 to expose the surface areas 22–28 and ohmic metal contacts 40–46 of Au-Ge-Ni are deposited into the vias using a conventional lift-off process (FIG. 6a–6b). The contacts 40–46 are alloyed to the wafer.

Figure 7:
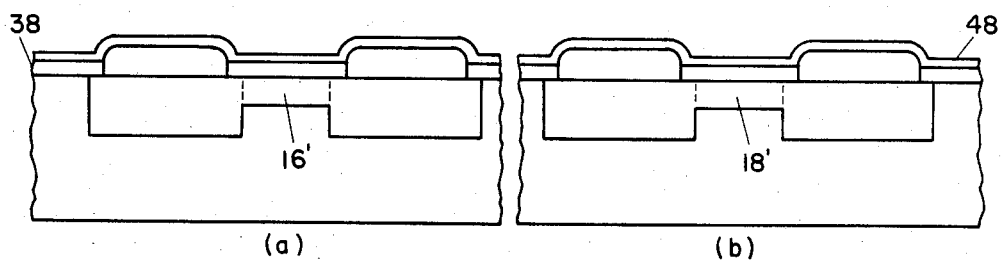
Figure 8:
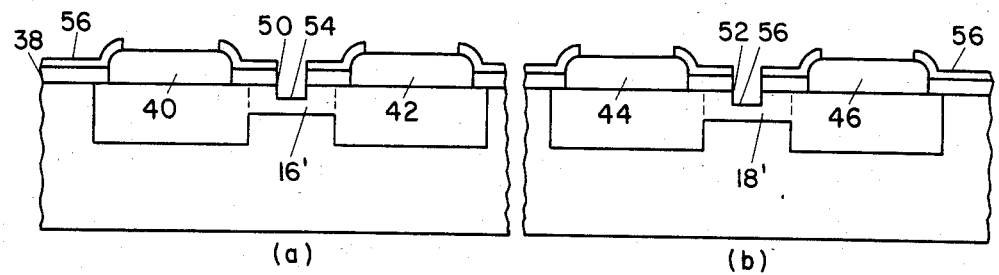
Figure 9:
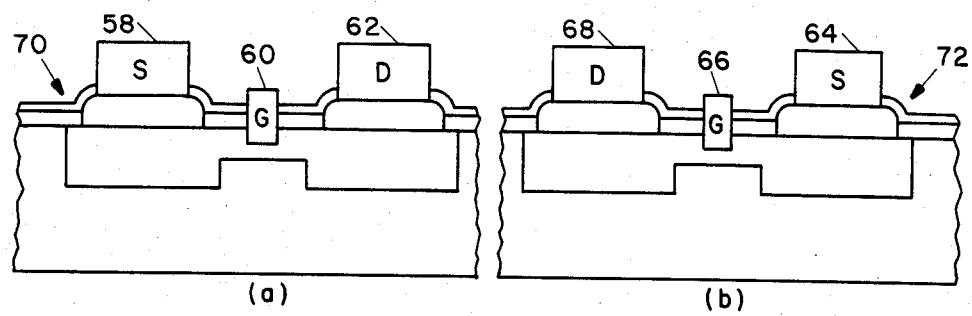

A second layer 48 of silicon nitride is deposited over the layer 38 and the contacts 40–46, as shown in FIG. 7a–7b. Vias are cut in the layer 48 to expose the ohmic contacts, and vias 50 and 52 (FIG. 8a–8b) are cut in the layers 38 and 56 to expose the channel regions 16' and 18'. The vias 50 and 52 are rectangular when viewed in plan. The longitudinal dimension of the via 52 is parallel to a <110> direction of the wafer and the longitudinal dimension of the via 50 is perpendicular to that <110> direction. The wafer is etched simultaneously through both vias 50 and 52 to form gate recesses 54 and 56 therein. Because of the orientation of the vias 50 and 52, the wafer is etched more rapidly through the via 50 than through the via 52 and therefore the recess 54 is deeper than the recess 56. Gate metal (Ti-Pd-Au) is then deposited over the ohmic contacts and into the gate recesses using a conventional lift-off process (FIG. 9a–9b). The transistors are then complete, and comprise an E-mode MESFET 70 having source, gate and drain electrodes 58, 60 and 62 formed by the gate metal, and a D-mode MESFET 72 having source, gate and drain electrodes 64, 66 and 68 formed of gate metal.

Figure 10:
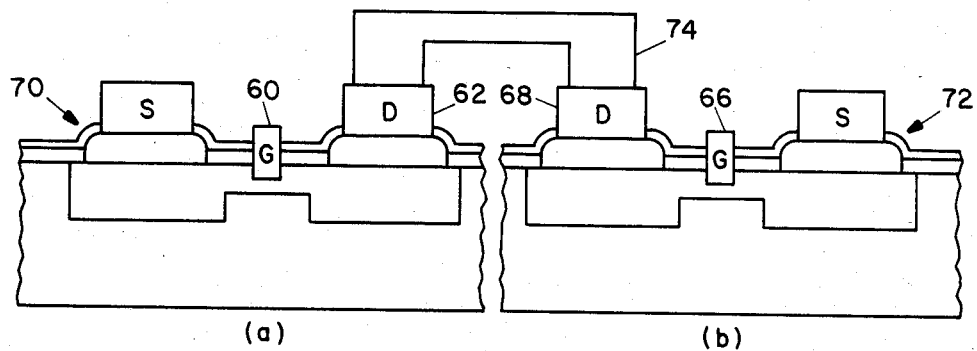
Figure 11:
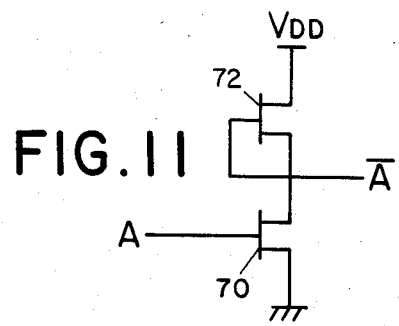
FIG. 11 is a schematic diagram of an inverter.

Interconnects between the transistors and other on-chip circuit elements, and between the transistors and terminals for connection to external circuitry, are established by means of a conventional air-bridge process. By way of example, FIG. 10a–10b shows an air-bridge interconnect 74 of Ti-Au between the drain 62 of the transistor 70 and the drain 68 of the transistor 72.

The critical gate voltage for a gallium arsenide MESFET is given by the expression $$V = -(q\, Na^2/2\epsilon_r\epsilon_o) + \phi$$

where q is the electron charge, N is the concentration of impurity in the channel region, a is the channel depth, $\epsilon_r$ is the relative dielectric constant of gallium arsenide, $\epsilon_o$ is the dielectric constant of air, and $\phi$ is the Schottky barrier height. It will be immediately apparent that different values of V can be obtained for a given value of N by varying the channel depth. This is achieved in the case of the described process by virtue of the different etching rates of the wafer in different directions. In the case of the described process, the value of a for the enhancement mode MESFET 70 is 0.1 μm, while for the depletion mode MESFET 72 it is 0.15 μm. With the value of N being $1\times10^{17}$ cm$^{-3}$, the value of V for the enhancement mode MESFET is 0.1 while that for the depletion mode MESFET is −0.8 volt.

Figure 12:
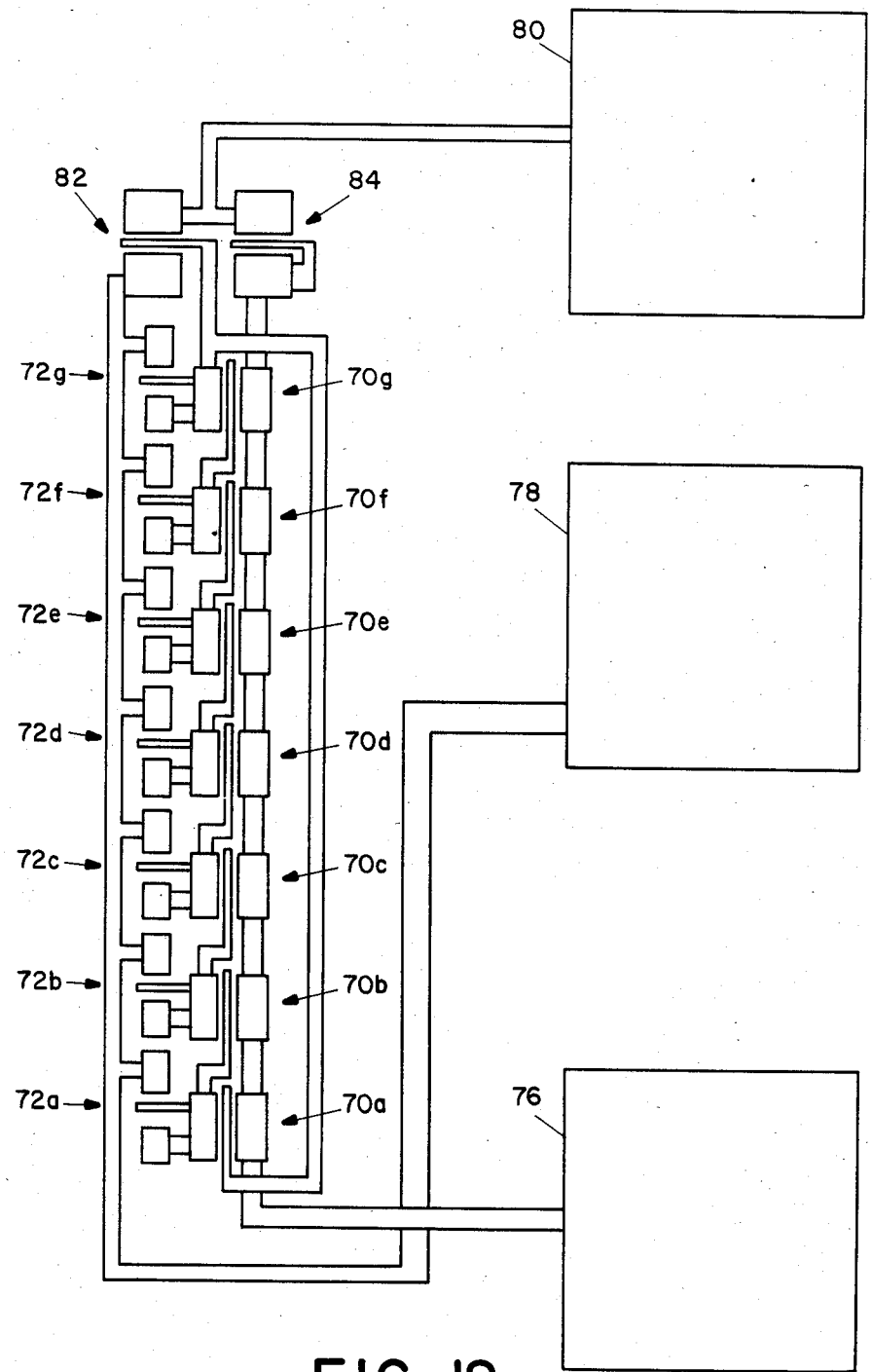
FIG. 12 is an enlarged plan view of part of a gallium arsenide wafer having a ring oscillator formed thereon.

It will be appreciated that the enhancement and depletion mode devices may be interconnected through the air bridges to provide various circuit functions, such as an inverter. An example of an inverter is shown in FIG. 12 and comprises one D-mode MESFET 72 and one E-mode MESFET 70. The signal input terminal of the inverter is connected to the gate of the transistor 70, the source of which is connected to ground. The drain of the transistor 70 is connected to the signal output terminal, the source of the transistor 72 and the gate of the transistor 72. The drain of the transistor 72 is connected to a reference voltage source $V_{DD}$. The connections to and between the various electrodes of the transistors are established using air bridges.

Figure 13:
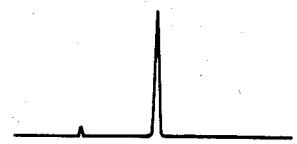
FIG. 13 is a spectrum analyzer display of the output signal of the ring oscillator.

An odd number of inverters as shown in FIG. 12 can be used to form a ring oscillator. For example, the ring oscillator shown in FIG. 13 is formed from seven inverter stages. Thus, the oscillator comprises seven E-mode transistors 70a ... 70g and seven D-mode transistors 72a ... 72g, paired together as shown in FIG. 12. The signal output from the drain of the last E-mode transistor 70g is returned to the gate of the first E-mode transistor 70a. The generally square areas 76, 78 and 80 represent the ground, $V_{DD}$ and output terminals respectively of the oscillator. The terminal 76 is connected to the source electrodes of the seven E-mode transistors 70a ... 70g and the terminal 78 is connected to the drain electrodes of the seven D-mode transistors 72a ... 72g. The signal output (the drain of the transistor 70g) is connected to the terminal 80 by way of a buffer comprising two D-mode transistors 82 and 84. The buffer does not affect the operation of the oscillator but is included merely to facilitate measurement of the output signal of the oscillator. FIG. 14 represents the output signal of the ring oscillator, as shown by a spectrum analyzer. The frequency peak occurs at 1.089 GHz. It is well known that the reciprocal of the frequency of a ring oscillator is equal to the number of stages in the oscillator multiplied by twice the propagation delay per stage. It therefore follows that the propagation delay per stage is 65.6 ps.

The described process permits the fabrication of both enhancement mode and depletion mode MESFETS using the same ion implantation step to form the channel regions of both transistors. This reduces the number of processing steps that are required to manufacture the transistors, compared with conventional processes, and improves the yield of the process, thus ultimately reducing the cost.

It will be appreciated that the invention is not restricted to the particular process which has been described since variations may be made therein without departing from the scope of the invention as defined in the appended claims, and equivalents thereof. For example, the invention is not applicable only to a gallium arsenide substrate, but may be used with other compound semiconductors which are anisotropically etchable. For example, it is known to manufacture a MESFET using a substrate of semi-insulating gallium arsenide having at least one layer of a compound semiconductor, such as AlGaAs, deposited thereon (such as the high electron mobility transistor and the two-dimensional electron gas FET) such that the channel region is formed within the aluminum gallium arsenide, and the invention is applicable to this device structure.

I claim:

1. A method of manufacturing field effect transistors utilizing a substrate of monocrystralline compound semiconductor material having impurity ions implanted therein to a predetermined depth below a main surface of the substrate in at least two regions of the substrate, said method comprising defining two elongated gate areas of said main surface, over said two regions respectively, which gate areas have their longitudinal dimensions so oriented with respect to the crystal axes of the substrate that the substrate material is more readily etchable through one of said gate areas than through the other gate area, etching the semiconductor material through both said gate areas simultaneously with the same etchant, whereby recesses of different respective depths, each less than said predetermined depth, are formed in the substrate, and depositing metal into said recesses.

2. A method of manufacturing a device for controlling transfer of electrical charge within a substrate of monocrystalline compound semiconductor material, said method comprising defining two elongated areas of the surface of the substrate, which elongated areas have their longitudinal dimensions so oriented with respect to the crystal axes of the semiconductor material that the semiconductor material is more readily etchable through one of said areas than through the other area, and etching the semiconductor material through both said elongated areas simultaneously with the same etchant, whereby recesses of different respective depths are formed in the substrate.

3. A method according to claim 2, further comprising forming in each recess a structure for influencing the behavior of charge carriers within the substrate.

4. A method according to claim 2, wherein the substrate has impurity ions present therein to a predetermined depth below a main surface of the substrate, and said two elongated areas are both defined at said main surface and the depth of each recess is less than said predetermined depth.

5. A method according to claim 2, comprising, prior to defining said elongated areas, implanting impurity ions in the substrate to a predetermined depth below a main surface of the substrate in at least two discrete regions of the substrate, and wherein the two elongated areas are areas of said main surface, defined over said two regions respectively.

6. A method according to claim 3, wherein the step of forming in each recess a structure for influencing the behavior of charge carriers within the substrate comprises depositing metal into said recesses.

7. A method according to claim 5, wherein the step of implanting impurity ions in the substrate comprises a first implantation step in which impurity ions are implanted into the substrate to said predetermined depth in said two regions, and a second implantation step in which additional impurity ions are implanted into the substrate in first and second portions of each of said first and second regions, said first and second portions of each region being separated from each other by a third portion, and wherein the elongated areas are defined over said third portions of said two regions respectively.

8. A method according to claim 7, comprising establishing ohmic contact to each of said first and second regions and forming in each recess a structure for influencing the behavior of charge carriers in the substrate.

9. A method according to claim 8, wherein the step of forming in each recess a structure for influencing the behavior of charge carriers in the substrate comprises depositing metal into said recesses.

10. A method according to claim 8, further comprising establishing electrical connection between the ohmic contact made to the first portion of one region and the ohmic contact made to the first portion of the other region.

* * * * *